United States Patent
Sato et al.

(10) Patent No.: US 11,370,669 B2
(45) Date of Patent: Jun. 28, 2022

(54) AMORPHOUS SILICON DOPED YTTRIUM OXIDE FILMS AND METHODS OF FORMATION

(71) Applicant: Applied Materials, Inc., Santa Clara, CA (US)

(72) Inventors: Tatsuya E. Sato, San Jose, CA (US); Li-Qun Xia, Cupertino, CA (US); Sean M. Seutter, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 272 days.

(21) Appl. No.: 16/247,123

(22) Filed: Jan. 14, 2019

(65) Prior Publication Data

US 2019/0221426 A1    Jul. 18, 2019

Related U.S. Application Data

(60) Provisional application No. 62/617,291, filed on Jan. 14, 2018.

(51) Int. Cl.
| | | |
|---|---|---|
| *C23C 16/455* | (2006.01) | |
| *C01F 17/218* | (2020.01) | |
| *H01L 21/02* | (2006.01) | |
| *C23C 16/40* | (2006.01) | |
| *C09D 1/00* | (2006.01) | |

(52) U.S. Cl.
CPC .............. *C01F 17/218* (2020.01); *C09D 1/00* (2013.01); *C23C 16/405* (2013.01); *C23C 16/45531* (2013.01); *C23C 16/45553* (2013.01); *H01L 21/0228* (2013.01); *H01L 21/02192* (2013.01); *C01P 2002/54* (2013.01)

(58) Field of Classification Search
None
See application file for complete search history.

(56) References Cited

U.S. PATENT DOCUMENTS

| | | |
|---|---|---|
| 6,686,489 B2 | 2/2004 | Celinska et al. |
| 6,858,546 B2 | 2/2005 | Niinisto et al. |
| 7,544,398 B1 | 6/2009 | Chang et al. |
| 7,737,559 B2 | 6/2010 | Smythe |
| 8,399,320 B2 | 3/2013 | Ahn et al. |
| 2012/0061799 A1* | 3/2012 | Hashim ............. H01L 21/02192 257/532 |
| 2013/0119531 A1* | 5/2013 | Tanaka .............. H01L 27/11568 257/734 |
| 2013/0193485 A1* | 8/2013 | Akiyama .............. H01L 29/778 257/194 |
| 2015/0311273 A1* | 10/2015 | Lin ......................... H01L 28/40 257/532 |

FOREIGN PATENT DOCUMENTS

| | | | | |
|---|---|---|---|---|
| JP | 2015035597 A | * | 2/2015 | ....... H01L 29/78648 |
| WO | WO-2009042982 A1 | * | 4/2009 | ....... H01L 21/02194 |
| WO | WO-2014123415 A1 | * | 8/2014 | ....... C23C 16/45563 |

* cited by examiner

*Primary Examiner* — Joel G Horning
(74) *Attorney, Agent, or Firm* — Servilla Whitney LLC

(57) ABSTRACT

Amorphous silicon doped yttrium oxide films and methods of making same are described. Deposition of the amorphous silicon doped yttrium oxide film by thermal chemical vapor deposition or atomic layer deposition process are described.

13 Claims, No Drawings

AMORPHOUS SILICON DOPED YTTRIUM OXIDE FILMS AND METHODS OF FORMATION

CROSS-REFERENCE TO RELATED APPLICATIONS

This application claims priority to U.S. Provisional Application No. 62/617,291, filed Jan. 14, 2018, the entire disclosure of which is hereby incorporated by reference herein.

FIELD

Embodiments of the disclosure generally relate to amorphous silicon doped yttrium oxide films. Additional embodiments of the disclosure are directed to methods for producing yttrium oxide films doped with silicon. More particularly, some embodiments, deposit amorphous silicon doped yttrium oxide films through atomic layer deposition.

BACKGROUND

Etch selective films are used in patterning applications in semiconductor manufacturing processes. Patterning using films with different etch selectivities reduces the need for costly lithography methods. The ability to etch one film but not another film (also referred to as selectively etching one film over another film) uses fewer process steps than lithographic techniques.

Titanium nitride (TiN) is a common film used in microelectronics devices. During device manufacturing there is a need to etch TiN without etching other materials in the device. To accomplish this, the materials that need to be protected from the TiN etch can be covered in a material that shows high etch contrast to TiN. However, there are not many materials that show high dry etch selectivity to TiN using a halide based reactive ion (RI) etch. Common materials such as SiN, $TiO_2$, $HfO_2$ and $ZrO_2$ are not resistant enough to halide based etchants to attain the high etch selectivities required for device manufacturing. Yttrium oxide has one of the highest etch selectivities relative to TiN under Cl-based dry etch conditions. But yttrium oxide is typically crystalline, decreasing its usefulness for patterning applications in advanced node semiconductor manufacturing.

Therefore, there is a need in the art for new materials with high etch contrast to TiN and methods for forming these materials.

SUMMARY

One or more embodiments of the disclosure is directed to a method comprising exposing a substrate in a processing chamber to a deposition cycle comprising exposure to a yttrium precursor, an oxygenating agent and a silicon precursor to form an amorphous silicon doped yttrium oxide film.

Additional embodiments of the disclosure are directed to a method comprising exposing a substrate to a deposition cycle. The deposition cycle comprises at least one exposure to a yttrium precursor, at least one exposure to an oxygenating agent, and at least one exposure a silicon precursor. The deposition cycle is repeated, in whole or in part, until an amorphous silicon doped yttrium oxide film of a predetermined thickness has been formed on the substrate.

Further embodiments of the disclosure are directed to a film comprising amorphous silicon doped yttrium oxide having a small silicon percentage.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on a layer formed on the substrate as disclosed in more detail below, and the term "substrate surface" is intended to include such layer as the context indicates. Thus for example, where a film/layer or partial film/layer has been deposited onto a substrate surface, the exposed surface of the newly deposited film/layer may be described as the substrate surface. What a given substrate surface comprises will depend on what materials are to be deposited, as well as the particular chemistry used.

"Atomic layer deposition" or "cyclical deposition" as used herein refers to a process comprising the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber. These reactive compounds may be separated temporally or spatially.

In a time-domain ALD process, exposure to each reactive compound is separated temporally (i.e., by a time delay) to allow each compound to adhere, adsorb and/or react on the substrate surface and then be purged from the processing chamber. The reactive gases are prevented from mixing by the purging of the processing chamber between subsequent exposures.

In one aspect of a time-domain ALD process, a first reactive gas (i.e., a first precursor or compound A) is pulsed into the reaction zone followed by a first time delay. A second precursor or compound B is pulsed into the reaction zone followed by a second delay. During each time delay, a purge gas, such as argon, may be introduced into the processing chamber to purge the reaction zone or otherwise remove any residual reactive compound or reaction products or by-products from the reaction zone. In some embodiments, the purge gas may flow continuously throughout the deposition process so that only the purge gas flows during the time delay between pulses of reactive compounds. The reactive compounds are alternately pulsed until a predetermined film or film thickness is formed on the substrate surface. In either scenario (discrete purge gas pulses or continuous purge gas flow), the ALD process of pulsing compound A, purge gas, compound B and purge gas may be referred to as a cycle. A cycle can start with either compound A or compound B and may continue the respective order of the cycle until achieving a film with the predetermined thickness.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the processing gases. During substrate movement, different portions of the substrate surface, or material on the substrate surface, are exposed to the two or more reactive compounds so that any given point on the substrate is substantially not exposed to more than one reactive compound simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In one aspect of a spatial ALD process, a first reactive gas and second reactive gas are delivered simultaneously to the reaction zone but are separated by a purge gas curtain and/or a vacuum curtain. The gas curtain can be a combination of inert gas flows into the processing chamber and vacuum stream flows out of the processing chamber. The substrate is moved relative to the gas delivery apparatus so that any given point on the substrate is exposed to the first reactive gas and the second reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

One or more embodiments of the disclosure advantageously provide methods of depositing amorphous silicon doped yttrium oxide films, referred to herein as "ASDYO films". Some embodiments of the disclosure advantageously provide methods for forming ASDYO films with low crystallinity and etch selectivity relative to TiN. Some embodiments of the disclosure advantageously provide methods of forming ASDYO films which provide higher growth per cycle rates and produce amorphous films while maintaining dry etch selectivity relative to TiN.

Some embodiments of the disclosure provide methods for forming ASDYO films. Some embodiments of the disclosure provide methods for forming ASDYO films of a predetermined thickness. Some embodiments of the disclosure provide for ASDYO films.

It should be understood by one skilled in the art that an amorphous silicon doped yttrium oxide film is a film comprising yttrium, oxygen and silicon which is amorphous in character, not a yttrium oxide film doped with amorphous silicon. The amorphous descriptor applies to the film as a whole, not only the silicon dopant within the film. In some embodiments, the ASDYO film consists essentially of yttrium, oxygen and silicon atoms. As used in this manner, the term "consists essentially of" means that the sum of the yttrium, oxygen and silicon atoms are greater than or equal to about 90%, 95%, 98%, 99% or 99.5% of the atomic composition of the film.

One or more embodiments of the disclosure are directed to a method of forming an ASDYO film. The method comprises exposing a substrate in a processing chamber to a deposition cycle comprising exposure to a yttrium precursor, an oxygenating agent and a silicon precursor.

The exposure of the substrate to the yttrium precursor, the oxygenating agent and the silicon precursor may be performed by any suitable process and performed in any suitable order or combination. In some embodiments, the exposure of the substrate may be performed by a chemical vapor deposition (CVD) process or an atomic layer deposition (ALD) process. In some embodiments, the substrate is exposed to substantially no plasma. As used in this regard, exposing the substrate to substantially no plasma means that the disclosed method is a thermal process. One skilled in the art will recognize that although the deposition process does not include plasma, in some embodiments, a pre-treatment or post-treatment process may utilize plasma.

The reactants (i.e. the yttrium precursor, the oxygenating agent and the silicon precursor) may be exposed to the substrate is any suitable order. In some embodiments, the order of exposure to the reactive gases includes the yttrium precursor, the oxygenating agent and then the silicon precursor. In some embodiments, the order of exposure to the reactive gases includes the yttrium precursor, the silicon precursor and then the oxygenating agent.

In some embodiments, each reactant is exposed to the substrate before any reactant is exposed to the substrate again. In some embodiments, a reactant may be repeated more often than other reactants or may have a longer exposure or dose than other reactants. For example, in some embodiments, the substrate is exposed to the yttrium precursor for a longer dose than for the silicon precursor or the oxygenating agent. In some embodiments, the order of exposure of the substrate to the reactive gases is the yttrium precursor, the silicon precursor, the yttrium precursor and then the oxygenating agent.

Each of the exposure orders provided represents a deposition cycle. In some embodiments, the deposition cycle is repeated. One skilled in the art will recognize that, due to their repetitive nature, multiple cycles of yttrium, oxygen, silicon is similar to multiple cycles of silicon, yttrium, oxygen.

In some embodiments, the process chamber is purged after exposing the substrate to one or more of the yttrium precursor, the oxygenating agent or the silicon precursor. Purging the process chamber can occur with any suitable inert gas. In some embodiments, the inert gas comprises one or more of argon or helium.

In some embodiments, two or more of the yttrium precursor, the oxygenating agent or the silicon precursor are exposed to the substrate at the same time. In some embodiments, the reactants may be co-flowed into the process chamber so that the reactants mix prior to entering a reaction volume within the process chamber. In some embodiments, the reactants are flowed separately into the process chamber and mix within the reaction volume. In some embodiments, the yttrium precursor, the oxygenating agent and the silicon precursor are exposed to the substrate separately.

In some embodiments, the yttrium precursor, the oxygenating agent and the silicon precursor are separated temporally (e.g. a time-domain ALD process). In some embodiments, the yttrium precursor, the oxygenating agent and the silicon precursor are separated spatially (e.g. a spatial ALD process).

In some embodiments, the yttrium precursor comprises a species with a general formula $YL_x$, where each L is independently selected from cyclopentadienes, substituted cyclopentadienes, alkyl amines, silyl amines, acetylacetonates, amidinates, and diazadienes, and x is an integer greater than 0 such that the overall charge of the species is neutral.

Substituted cyclopentadiene ligands may be substituted by any suitable number of alkyl substituents and/or amino substituents. Alkyl substituents for the cyclopentadiene ligand may include C1-C4 alkyl groups. Amino substituents for the cyclopentadiene ligand may include groups with the general formula —$NR_2$ where each R is independently H or a C1-C4 alkyl group. As used in this manner, the letter "C" followed by a numeral (e.g., "C4") means that the substituent comprises the specified number of carbon atoms (e.g., C4 comprises four carbon atoms). The alkyl groups can be straight chain groups (e.g. n-butyl) or branched groups (e.g. t-butyl). In some embodiments, the cyclopentadiene ligand is unsubstituted (i.e., $C_5H_5$).

In the yttrium precursor, the amine ligands may be C1-C4 alkyl substituted and/or C1-C4 silyl substituted (e.g. —N(Si(CH$_3$)$_3$)$_2$. Acetylacetonates ligands may be substituted with one or more halogen atoms (e.g. hexafluoroacetylacetonate, hfac). Amidinate ligands may have H and/or C1-C4 alkyl groups on one or both of the nitrogen atoms.

Diazadiene ligands can adopt several resonance forms when binding to a yttrium atom as depicted in scheme (I).

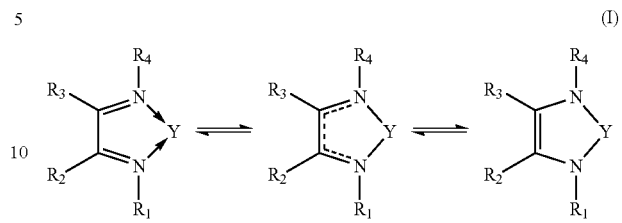

(I)

Each of these resonance forms imparts a different electronic charge on the yttrium metal center when bonded together in a metal complex. The form on the left containing two double bonds (the diene) is a neutral, nonionic ligand (DAD0). The resonance form in the center of scheme (I) contains a radical resonance structure and is a monoanionic ligand (DAD1). The resonance form on the right of scheme (I) containing a single double bond is a dianionic ligand (DAD2). For each of these resonance forms, $R_1$ and $R_4$ are independently selected from the group consisting of C1-C4 alkyl or amino groups; each of $R_2$ and $R_3$ are independently selected from H or C1-C4 alkyl or amino groups. As used in this manner, C1-C4 amino groups are directly bonded to the diazadiene ligand and may contain C1-C4 alkyl substituent groups that can be straight chain groups (e.g. n-butyl) or branched groups (e.g. t-butyl).

In some embodiments, the oxygenating agent comprises one or more of oxygen gas ($O_2$), ozone or water. In some embodiments, the oxygenating agent consists essentially of oxygen gas. As used in this regard, the term "consists essentially of" means that the reactive species in the oxygenating agent is greater than or equal to about 95%, 98% or 99% of the stated species.

In some embodiments, the silicon precursor comprises a siloxane, a silyl halide, or a silyl amide. Examples of silyl halides include, but are not limited to, dichlorosilane (DCS), hexachloridisilane (HCDS), trichlorosilane (TCS) and SiCl$_4$. Examples of silyl amides include, but are not limited to, bis(diethylamino)silane (BDEAS), bis(tert-butylamino)silane (BTBAS), tetrakis(dimethylamino)silane (TDMAS). In some embodiments, the silicon precursor comprises a species with a general formula $Si_nX_aR_{2n+2-a}$, $Si(NR'_2)_a$ $R_{4-a}$, or a siloxane, where n is 1 to 4, a is 0 to 2n+2, each X is an independently selected halide and each R and R' are independently selected from H, C1-4 alkyl or aryl. Suitable siloxanes include, but are not limited to, hexachlorodisiloxane (HCDSO) and octachlorotrisiloxane (OCTSO). In some embodiments, the silicon precursor consists essentially of silane (SiH$_4$)

In some embodiments, the ASDYO film comprises yttrium, oxygen and silicon. In some embodiments, the silicon content of the ASDYO film is less than or equal to about $10^{25}$ atoms/cm$^3$, or less than or equal to about $10^{24}$ atoms/cm$^3$, or less than or equal to about $10^{23}$ atoms/cm$^3$, or less than or equal to about $10^{22}$ atoms/cm$^3$, or less than or equal to about $10^{21}$ atoms/cm$^3$, or less than or equal to about $10^{20}$ atoms/cm$^3$, or less than or equal to about $10^{19}$ atoms/cm$^3$, or less than or equal to about $10^{18}$ atoms/cm$^3$, or less than or equal to about $10^{17}$ atoms/cm$^3$, or less than or equal to about $10^{16}$ atoms/cm$^3$, or less than or equal to about $10^{15}$ atoms/cm$^3$, or less than or equal to about $10^{14}$ atoms/cm$^3$, or less than or equal to about $10^{13}$ atoms/cm$^3$, or less than or equal to about $10^{12}$ atoms/cm$^3$, or less than or equal to about $10^{11}$ atoms/cm$^3$, or less than or equal to about $10^{10}$ atoms/cm$^3$, or less than or equal to about $10^9$ atoms/cm$^3$, or less than or equal to about $10^8$ atoms/cm$^3$, or less than or equal to about $10^7$ atoms/cm$^3$, or less than or equal to about $10^6$ atoms/cm$^3$, or less than or equal to about $10^5$ atoms/cm$^3$. In some embodiments, the ASDYO film has a small silicon percentage. In some embodiments, the ASDYO film comprises less than or equal to about 25%, 20%, 15%, 10%, 5%, 2%, 1%, 0.5%, 0.25%, 0.1% or 0.05% silicon, on an atomic basis.

In some embodiments, the ASDYO film has a ratio of silicon atoms to yttrium atoms less than or equal to about 1:200, or less than or equal to about 1:150, or less than or equal to about 1:100, or less than or equal to about 1:50, or less than or equal to about 1:40, or less than or equal to about 1:30, or less than or equal to about 1:20, or less than or equal to about 1:10, or less than or equal to about 1:5, or less than or equal to about 1:2, or less than or equal to about 1:1.5, or less than or equal to about 1:1.

In some embodiments, the ASDYO film has a volume percent crystallinity of less than or equal to about 10%, or less than or equal to about 5%, or less than or equal to about 2%, or less than or equal to about 1%, or less than or equal to about 0.5%, or less than or equal to about 0.2%, or less than or equal to about 0.1%.

In some embodiments, the ASDYO film is formed at a rate of greater than or equal to about 0.1 Å/cycle, or greater than or equal to about 0.12 Å/cycle, or greater than or equal to about 0.14 Å/cycle, or greater than or equal to about 0.16 Å/cycle, or greater than or equal to about 0.18 Å/cycle, or greater than or equal to about 0.2 Å/cycle, or greater than or equal to about 0.25 Å/cycle, or greater than or equal to about 0.3 Å/cycle.

Dry etch rate of the formed films may be evaluated using a Cl-based dry etch process. Dry etching may be performed by exposing a film to a plasma of an etchant. A Cl-based dry etch is performed using the plasma of a chlorine etchant. Examples of suitable etchants include, but are not limited to, $Cl_2$, HCl, $BCl_3$, $CCl_4$, and $SiCl_4$. Dry etching may be performed at any suitable temperature and any suitable pressure. Examples of suitable temperatures include, but are not limited to, temperatures in a range of about −30° C. to about 400° C., or in the range of about 25° C. to about 250° C. Examples of suitable pressures include, but are not limited to, pressures in a range of about 0.01 Torr to about 20 Torr, or in the range of about 0.1 Torr to about 5 Torr. Dry etching may utilize any suitable RF power to generate the etching plasma. Examples of suitable RF powers include, but are not limited to, powers in a range of about 40 watts to about 1500 watts, in a range of about 100 watts to about 1200 watts, in a range of about 250 watts to about 1000 watts, or in a range of about 400 watts to about 800 watts.

In some embodiments, the ASDYO film has a dry etch rate of less than or equal to about 10 Å/min, or less than or equal to about 15 Å/min, or less than or less to about 20 Å/min, or less than or equal to about 25 Å/min, or less than or equal to about 30 Å/min, or less than or equal to about 35 Å/min, or less than or equal to about 40 Å/min, or less than or equal to about 50 Å/min.

Dry etch rate ratio refers to the dry etch rate of the relevant material compared to the dry etch rate of titanium nitride. In some embodiments, the ASDYO film has higher selectivity relative to titanium nitride. In some embodiments, the ASDYO film has a dry etch rate ratio relative to titanium nitride of less than or equal to about 50, or less than or equal to about 40, or less than or equal to about 30, or less than or equal to about 25, or less than or equal to about 20, or less than or equal to about 15, or less than or equal to about 10, less than or equal to about 5, less than or equal to about 1, less than or equal to about 0.1, less than or equal to about 0.05, or less than or equal to about 0.01. In some embodiments, the ASDYO film has a dry etch rate ratio relative to titanium nitride is in the range of about 0.01 to about 10, or in the range of about 0.05 to about 5, or in the range of about 0.1 to about 1.

Described herein are some embodiments of the disclosure wherein an ASDYO film is formed using an atomic layer deposition (ALD) process. The method described below is exemplary and should not be construed as limiting. The methods of the disclosure may contain additional process steps to those described below.

In some embodiments, the yttrium precursor, the oxygenating agent and the silicon precursor are provided to the process chamber. The reactants can be provided as pure compounds, or may be diluted by a diluent or carrier gas. The reactive compound (including any diluent or carrier gas) supplied to the chamber is referred to as a process gas. Suitable diluent or carrier gases include, but are not limited to, argon, hydrogen, helium and other inert gasses.

Each process gas may be supplied under different parameters than other process gasses. A process gas may be provided in one or more pulses or continuously. The flow rate of a process gases can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. A process gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to a process gas may be any suitable amount of time to allow the formation of an adequate nucleation layer or reaction atop the substrate surface. For example, a process gas may be flowed into the process chamber for a period of about 0.1 seconds to about 90 seconds. In some time-domain ALD processes, a process gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as a process gas. The inert gas may be mixed with a process gas (e.g., as a diluent gas) or separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, combinations thereof, or the like.

The temperature of the substrate during deposition can be controlled, for example, by setting the temperature of a substrate support or susceptor. In some embodiments the substrate is maintained at a temperature in the range of about 200° C. to about 400° C., or in the range of about 225° C. to about 375° C., or in the range of about 235° C. to about 375° C., or in the range of about 250° C. to about 350° C., or in the range of about 300° C. to about 350° C. In one or more embodiments, the substrate is maintained at a temperature less than about 400° C., or less than about 375° C., or less than about 350° C., or less than about 325° C., or less than about 300° C., or less than about 275° C., or less than about 250° C.

In addition to the foregoing, additional process parameters may be regulated while exposing the substrate to a process gas. For example, in some embodiments, the process chamber may be maintained at a pressure in the range of about 1 Torr to about 100 Torr, or in the range of about 5 Torr to about 75 Torr, or in the range of about 6 Torr to about 50 Torr, or in the range of about 6.5 Torr to about 25 Torr.

After exposing the substrate to one process gas, the process chamber (especially in time-domain ALD) may be purged using an inert gas. (This may not be needed in spatial ALD processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the first process gas. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the first process gas, described above, or in some embodiments, the flow rate may be increased or decreased. For example, in some embodiments, the inert gas may be provided to the process chamber at a flow rate of greater than 0 to about 10000 sccm to purge the process chamber. In spatial ALD, purge gas curtains are maintained between the flows of reactive gases and purging the process chamber may not be necessary. In some embodiments of a spatial ALD process, the process chamber or region of the process chamber may be purged with an inert gas.

The flow of inert gas may facilitate removing any excess process gases and/or excess reaction byproducts from the process chamber to prevent unwanted gas phase reactions. For example, the flow of inert gas may remove excess process gas from the process chamber, preventing a reaction between the yttrium precursor and a subsequent process gas.

Then the substrate is exposed to a second process gas for a second period of time. The second process gas may react with the species on the substrate surface. The second process gas may be supplied to the substrate surface at a flow rate greater than the first process gas. In one or more embodiments, the flow rate is greater than about 1 time that of the first process gas, or about 100 times that of the first process gas, or in the range of about 3000 to 5000 times that of the first process gas. The second process gas can be supplied, in time-domain ALD, for a time in the range of about 1 sec to about 30 sec, or in the range of about 5 sec to about 20 sec, or in the range of about 10 sec to about 15 sec. The second process gas can be supplied at a pressure in the range of about 1 Torr to about 30 Torr, or in the range of about 5 Torr to about 25 Torr, or in the range of about 10 Torr to about 20 Torr, or up to about 50 Torr. The substrate temperature can be maintained at any suitable temperature. In one or more embodiments, the substrate is maintained at a temperature less than about 475° C., or at a temperature about the same as that of the substrate during exposure to the first process gas.

The process chamber may again be purged using an inert gas. The inert gas may be any inert gas, for example, such as argon, helium, neon, or the like. In some embodiments, the inert gas may be the same, or alternatively, may be different from the inert gas provided to the process chamber during previous process steps. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of greater than 0 to about 10,000 sccm to purge the process chamber.

While the embodiment of the processing method described above includes only two pulses of reactive gases, it will be understood that this is merely exemplary and that additional pulses of process gases may be used. The pulses can be repeated in their entirety or in part. The cycle can be repeated to form a film of a predetermined thickness.

Some embodiments of this disclosure relate to a method comprising exposing a substrate to a deposition cycle comprising at least one exposure to a yttrium precursor, at least one exposure to an oxygenating agent, and at least one exposure a silicon precursor. The deposition cycle is repeated, in whole or in part, until an amorphous silicon doped yttirum oxide (ASDYO) film of a predetermined thickness has been formed on the substrate. In some embodiments, the ASDYO film has a thickness in the range of about 1 Å to about 100 Å, or in the range of about 5 Å to about 50 Å, or in the range of about 10 Å to about 1,000 Å, or in the range of about 100 Å to about 800 Å, or in the range of about 200 Å to about 600 Å, or in the range of about 300 Å to about 500 Å In some embodiments, the exposures of the deposition cycle are separated by one or more purge cycle.

Some embodiments of the disclosure provide an ASDYO film having a composition where the sum of the atomic percent of silicon, yttrium, oxygen and carbon is greater than or equal to about 90%, 95%, 98%, 99% or 99.5% of the film composition. In some embodiments, silicon is in the range of about 0.5-20 atomic percent, 1-18 atomic percent or 2-15 atomic percent silicon, the yttrium is present in the range of about 5-30 atomic percent, 10-20 atomic percent or 12-18 atomic percent, oxygen is present in the range of about 30-70 atomic percent, 35-65 atomic percent, 40-60 atomic percent or 45-55 atomic percent, and carbon is present in the range of about 1-40 atomic percent, 10-35 atomic percent, 15-30 atomic percent, 20-25 atomic percent. In some embodiments, the ASDYO film comprises greater than or equal to about 0.5, 1, 2, 5 or 10 atomic percent carbon and less than or equal to about 50, 45, 40, 35, 30, 25, 20, 15 or 10 atomic percent carbon.

Additional embodiments of this disclosure relate to an ASDYO film. Some embodiments relate to a semiconductor device comprising an ASDYO film.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method consisting essentially of:
exposing a substrate in a processing chamber to a deposition cycle comprising exposure to a yttrium precursor comprising one or more of a cyclopentadiene and a substituted cyclopentadiene, an oxygenating agent and a silicon precursor comprising one or more of a siloxane, a silyl halide, and a silyl amide to form an amorphous silicon doped yttrium oxide film; and
performing a Cl-based dry etch process comprising exposing the amorphous silicon doped yttrium oxide film to a plasma of a chlorine etchant, wherein the Cl-based dry etch process is performed at a temperature in a range of about −30° C. to about 400° C., a pressure in a range of about 0.01 Torr to about 20 Torr, and RF power in a range of about 40 watts to about 1500 watts and the amorphous silicon doped yttrium oxide film has a silicon content less than or equal to about 25 atomic percent, a higher etch selectivity relative to titanium nitride (TiN) wherein a dry etch ratio of the amorphous silicon doped yttrium oxide film relative to titanium nitride (TiN) is less than or equal to about 50, and a dry etch rate of less than or equal to about 50 Å/min.

2. The method of claim 1, wherein the yttrium precursor, the oxygenating agent and the silicon precursor are exposed to the substrate separately.

3. The method of claim 2, further comprising purging the processing chamber after exposure to one or more of the yttrium precursor, the oxygenating agent or the silicon precursor.

4. The method of claim 2, wherein the yttrium precursor, the oxygenating agent and the silicon precursor are separated temporally.

5. The method of claim 2, wherein the yttrium precursor, the oxygenating agent and the silicon precursor are separated spatially.

6. The method of claim 2, wherein the oxygenating agent comprises one or more of oxygen, ozone or water.

7. The method of claim 1, wherein the amorphous silicon doped yttrium oxide film has a ratio of silicon atoms to yttrium atoms less than or equal to about 1:2.

8. The method of claim 1, wherein the amorphous silicon doped yttrium oxide film has a volume percent crystallinity less than or equal to about 10%.

9. The method of claim 1, wherein the substrate is maintained at a temperature in a range from about 200° C. to about 400° C.

10. The method of claim 1, wherein the amorphous silicon doped yttrium oxide film is formed at a rate of greater than or equal to about 0.1 Å/cycle.

11. The method of claim 10, wherein the amorphous silicon doped yttrium oxide film is formed at a rate of greater than or equal to about 0.2 Å/cycle.

12. A method consisting essentially of:
exposing a substrate to a deposition cycle comprising at least one exposure to a yttrium precursor comprising one or more of a cyclopentadiene and a substituted cyclopentadiene, at least one exposure to an oxygenating agent, and at least one exposure a silicon precursor comprising one or more of a siloxane, a silyl halide, and a silyl amide to form an amorphous silicon doped yttrium oxide film;
performing a Cl-based dry etch process comprising exposing the amorphous silicon doped yttrium oxide film to a plasma of a chlorine etchant, wherein the CL-based dry etch process is performed at a temperature in a range of about −30° C. to about 400 ° C., a pressure in a range of about 0.01 Torr to about 20 Torr, and RF power in a range of about 40 watts to about 1500 watts and the amorphous silicon doped yttrium oxide film has a silicon content less than or equal to about 25 atomic percent, a higher etch selectivity relative to titanium nitride (TiN) wherein a dry etch ratio of the amorphous silicon doped yttrium oxide film relative to titanium nitride (TiN) is less than or equal to about 50, and a dry etch rate of less than or equal to about 50 Å/min; and
repeating the deposition cycle, in whole or in part, until an amorphous silicon doped yttrium oxide film of a predetermined thickness has been formed on the substrate.

13. The method of claim 12, wherein the exposures are separated by one or more purge cycle.

* * * * *

UNITED STATES PATENT AND TRADEMARK OFFICE
CERTIFICATE OF CORRECTION

PATENT NO. : 11,370,669 B2
APPLICATION NO. : 16/247123
DATED : June 28, 2022
INVENTOR(S) : Tatsuya E. Sato et al.

It is certified that error appears in the above-identified patent and that said Letters Patent is hereby corrected as shown below:

In the Specification

•Column 10, Line 28, after "doped", and before "oxide", replace "yttirum" with "yttrium".

Signed and Sealed this
Thirtieth Day of August, 2022

Katherine Kelly Vidal
*Director of the United States Patent and Trademark Office*